(12) United States Patent
Tokunaga et al.

(10) Patent No.: US 9,818,601 B1
(45) Date of Patent: Nov. 14, 2017

(54) SUBSTRATE PROCESSING APPARATUS AND METHOD OF PROCESSING SUBSTRATE

(71) Applicant: ASM IP Holding B.V., Almere (NL)

(72) Inventors: Masaki Tokunaga, Tama (JP); Masaru Zaitsu, Kawasaki (JP); Atsuki Fukazawa, Tama (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/278,797

(22) Filed: Sep. 28, 2016

(51) Int. Cl.
| | |
|---|---|
| *H01L 21/31* | (2006.01) |
| *H01L 21/02* | (2006.01) |
| *C23C 16/455* | (2006.01) |
| *C23C 16/50* | (2006.01) |
| *C23C 16/52* | (2006.01) |

(52) U.S. Cl.
CPC .. *H01L 21/02274* (2013.01); *C23C 16/45544* (2013.01); *C23C 16/45565* (2013.01); *C23C 16/50* (2013.01); *C23C 16/52* (2013.01); *H01L 21/0217* (2013.01); *H01L 21/0228* (2013.01); *H01L 21/02164* (2013.01)

(58) Field of Classification Search
CPC ........... H01L 21/02274; H01L 21/0217; H01L 21/0228; H01L 21/02164
USPC ........................................................ 438/788
See application file for complete search history.

(56) References Cited

U.S. PATENT DOCUMENTS

| | | | |
|---|---|---|---|
| 8,539,908 B2* | 9/2013 | Takagi | C23C 16/45521 |
| | | | 118/695 |
| 9,028,648 B1* | 5/2015 | Kamakura | C23C 16/4405 |
| | | | 118/715 |

FOREIGN PATENT DOCUMENTS

JP   H01-156477 A   6/1989

\* cited by examiner

*Primary Examiner* — Anthony Ho
(74) *Attorney, Agent, or Firm* — Studebaker & Brackett PC

(57) ABSTRACT

A substrate processing apparatus includes a chamber, a stage provided in the chamber, a shower head in which a plurality of slits are formed, and which is opposed to the stage, an opening/closing part for opening and closing the plurality of slits, a first gas supply part which supplies a gas to a space between the stage and the shower head via the plurality of slits, and a second gas supply part which is connected to a side wall of the chamber, and which supplies a gas to the space between the stage and the shower head.

7 Claims, 8 Drawing Sheets

SUBSTRATE PROCESSING APPARATUS AND METHOD OF PROCESSING SUBSTRATE

BACKGROUND OF THE INVENTION

Field of the Invention

The present invention relates to a substrate processing apparatus used to process a substrate such as a semiconductor wafer and to a method of processing a substrate by using the substrate processing apparatus.

Background Art

Plasma atomic layer deposition and chemical vapor phase deposition performed at a low pressure and non-equilibrium plasma atomic layer deposition and chemical vapor phase deposition performed at atmospheric pressure are well-known techniques. Japanese Patent Laid-Open No. H1-156477 discloses a plasma CVD apparatus showering electrode having a multiplicity of gas outflow holes dispersedly formed therein. The gas outflow holes of this plasma CVD apparatus showering electrode are opened and closed with a shutter, thereby enabling sharp shutoff of a raw material gas.

When plasma atomic layer deposition or chemical vapor phase deposition is performed at a low pressure, plasma radiation to side walls of a pattern in particular is weak because the mean free path of a plasma species is long and the anisotropy is strong. This condition may cause degradation of the quality of a film on the side walls of the pattern. For example, as a result of degradation of the quality of the film on the side walls, the rate of etching on the side walls is increased relative to the rate of etching on an upper surface of the pattern. Improving the side wall film quality requires modification processing.

On the other hand, a plasma at a high pressure such as atmospheric pressure has a shorter mean free path of a plasma species and is capable of isotropic plasma radiation to a pattern. An effect of improving the quality of a film on side wall portions of a pattern can therefore be expected. High-pressure plasma, however, can change easily into thermal equilibrium plasma such as an arc. Various devices are required for generation of uniform and stable non-equilibrium plasma suitable for a film forming process.

In a case where a shower head type of upper electrode is used as an upper electrode in plane-parallel electrodes, shower head hole discharge may occur in a high-pressure region of 10 kPa or higher in addition to light emission between the electrodes. Shower head hole discharge causes degradation of in-plane uniformity of a process.

Low-pressure plasma and high-pressure plasma thus have advantages and disadvantages. It is, therefore, desirable to properly use one of low-pressure plasma and high-pressure plasma or a combination of low-pressure plasma and high-pressure plasma according to needs. That is, there is a demand for a substrate processing apparatus and a substrate processing method capable of generating low-pressure non-equilibrium plasma and high-pressure non-equilibrium plasma with uniformity and stability by using one chamber.

SUMMARY OF THE INVENTION

In view of the above-described problem, an object of the present invention is to provide a substrate processing apparatus and a substrate processing method capable of generating low-pressure non-equilibrium plasma and high-pressure non-equilibrium plasma with uniformity and stability by using one chamber.

The features and advantages of the present invention may be summarized as follows.

According to one aspect of the present invention, a substrate processing apparatus includes a chamber, a stage provided in the chamber, a shower head in which a plurality of slits are formed, and which is opposed to the stage, an opening/closing part for opening and closing the plurality of slits, a first gas supply part which supplies a gas to a space between the stage and the shower head via the plurality of slits, and a second gas supply part which is connected to a side wall of the chamber, and which supplies a gas to the space between the stage and the shower head.

According to another aspect of the present invention, a method of processing a substrate, includes a downflow processing process in which a gas is supplied to a space between a shower head and a stage in a chamber through a plurality of slits in the shower head, and in which radiofrequency waves are applied to the shower head and/or the stage to perform plasma processing on a substrate on the stage, and a sideflow processing process in which a gas is supplied from a side surface of the chamber to the space between the shower head and the stage while the plurality of slits are closed by an opening/closing part for opening and closing the plurality of slits, and in which radiofrequency waves are applied to the shower head and/or the stage to perform plasma processing on the substrate.

According to another aspect of the present invention, a method of processing a substrate, includes a sideflow processing process in which a gas is supplied from a side surface of a chamber to a space between a shower bead and a stage in a chamber while a plurality of slits in the shower head are closed by an opening/closing part, and in which radiofrequency waves are applied to the shower head and/or the stage to perform plasma processing on a substrate on the stage.

Other and further objects, features and advantages of the invention will appear more fully from the following description.

DETAILED DESCRIPTION OF THE PREFERRED EMBODIMENTS

Figure 1:
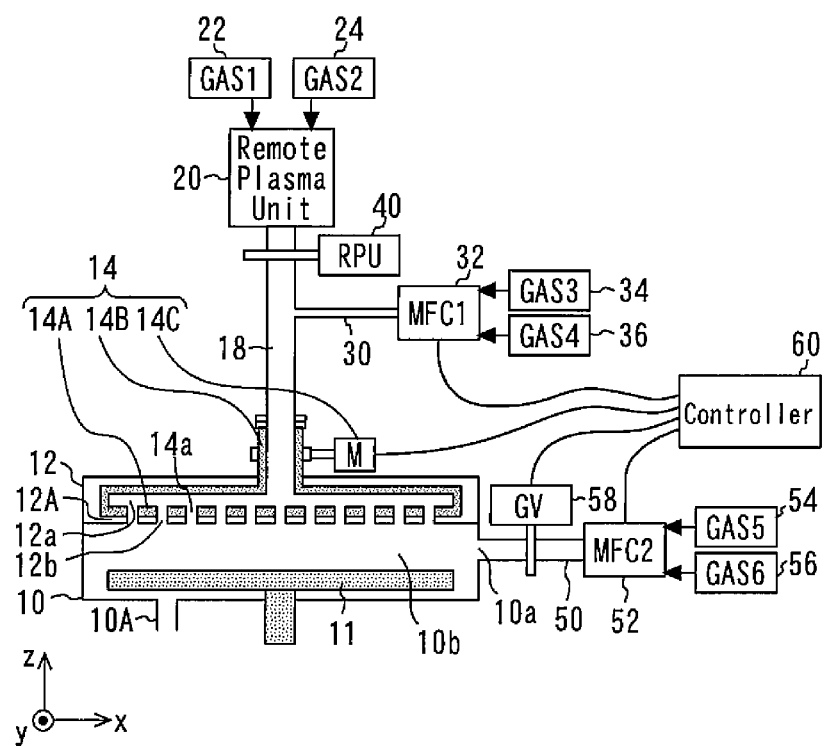
FIG. 1 is a sectional view of a substrate processing apparatus according to a first embodiment.

Substrate processing apparatuses and substrate processing methods according to embodiments of the present invention will be described with reference to the drawings. Components identical or corresponding to each other are assigned the same reference characters, and repeated description for them in some cases is avoided.

First Embodiment

FIG. 1 is a sectional view of a substrate processing apparatus according to a first embodiment of the present invention. The substrate processing apparatus has a chamber 10. An exhaust hole 10A is formed in a bottom portion of the chamber 10. An opening 10a is provided in a side surface of the chamber 10. A stage 11 is provided in the chamber 10. The stage 11 is not particularly specified, as long as it is capable of supporting a substrate. However, the stage 11 is, for example, a susceptor.

A shower head 12 is provided above and in opposition to the stage 11. The shower head 12 and the stage 11 constitute plane-parallel electrodes. The shower head 12 forms a gas distribution chamber 12a, which is a space in disk form. The shower head 12 has a plate 12A in which a plurality of slits 12b are formed. A gas supplied to the gas distribution chamber 12a is supplied onto the stage 11 through the slits 12b.

An opening/closing part 14 for opening/closing the plurality of slits 12b is provided mainly in the shower head 12. The opening/closing part 14 includes a shielding member 14A in which a plurality of holes 14a are provided, a supply part 14B connecting to the shielding member 14A and a rotating part 14C for rotating the supply part 14B. The shielding member 14A is in the gas distribution chamber 12a.

The supply part 14B is a part extending along a z-plus direction from an upper end of the shielding member 14A. In the supply part 14B, a passage which communicates with the gas distribution chamber 12a is provided. The rotating part 14C is arranged to rotate the supply part 14B about a z-axis with a motor or the like. When the supply part 14B is rotated by the rotating part 14C, the shielding member 14A is also rotated. When the shielding member 14A is rotated so that the plurality of holes 14a provided in the shielding member 14A are superposed right on the slits 12b, the slits 12b are opened.

Figure 2:
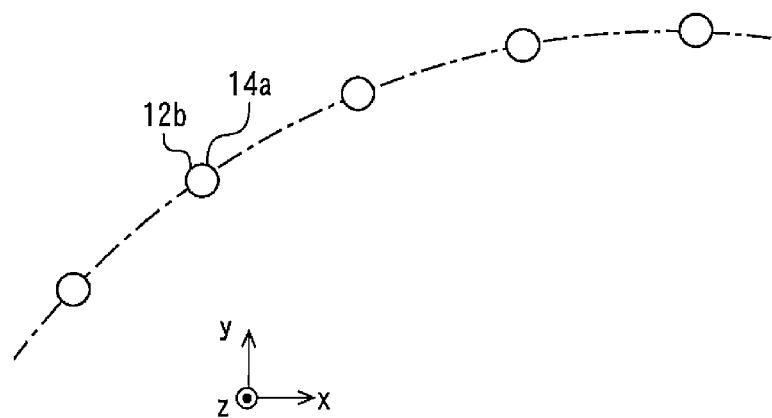
FIG. 2 is a plan view showing the relationship between the slits and the holes.

FIG. 2 is a plan view showing the relationship between the slits 12b and the holes 14a of the opening/closing part 14. In FIG. 2, only part of the plurality of slits 12b and part of the plurality of holes 14a are shown for ease of illustration. FIG. 2 illustrates a state in which the plurality of holes 14a are superposed right on the slits 12b. A dot-dash line indicates a locus of the holes 14a when the shielding member 14A is rotated.

When the shielding member 14A is rotated so that the plurality of holes 14a are displaced from the positions right on the slits 12b, the slits 12b are closed with the shielding member 14A. While the shielding member 14A and the supply part 14B are rotated, the shower head 12 is maintained in a stationary state without being rotated.

Figure 3:
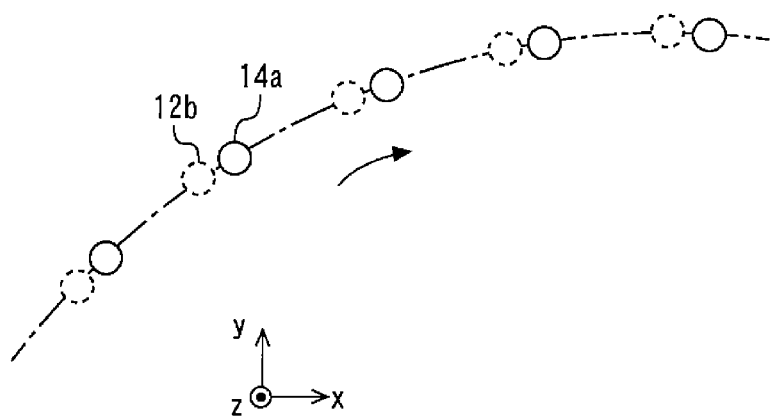
FIG. 3 shows a state where the holes are displaced from the positions right above the slits.

FIG. 3 shows a state where the holes 14a are displaced from the positions right above the slits 12b as a result of slightly rotating the shielding member 14A in the direction of an arrow. When the slits 12b are again opened from this state, the shielding member 14A is rotated in the direction opposite to the direction of the arrow shown in FIG. 3. Several hundred slits 12b are ordinarily formed in the shower head 12. From the viewpoint of opening/closing all the slits 12b with reliability, it is preferable to make the holes 14a and the slits 12b completely identical in planar shape to each other.

Referring back to FIG. 1, a transport tube 18 is connected to an upper end of the opening/closing part 14. In the transport tube 18, a passage which extends generally vertically and communicates with the gas distribution chamber 12a is provided. The transport tube 18 does not rotate even when the supply part 14B is rotated.

A remote plasma unit 20 is provided on an upper end of the transport tube 18. The remote plasma unit 20 converts a gas into a plasma state. Gas sources 22 and 24 are connected to the remote plasma unit 20. Each of the gas sources 22 and 24 supplies a cleaning gas to be used to clean the chamber 10 and other components. When the gas is supplied from the gas source 22 or 24 to the remote plasma unit 20, a reactive species is produced in the remote plasma unit 20. This reactive species is used for cleaning of the chamber 10 and other components.

A gas supply line 30 is connected to a side surface of the transport tube 18. In the gas supply line 30, a passage which communicates with the space in the transport tube 18 is provided. The gas supply line 30 is connected generally perpendicularly to the transport tube 18.

A first mass flow controller (MFC) 32 is connected to the gas supply line 30. The mass flow controller is hereinafter referred to as "MFC". Gas sources 34 and 36 are connected to the first MFC 32. Each of the gas sources 34 and 36 supplies a material gas to be used for film forming. The gas from the gas source 34 or 36 is provided into the passage in the gas supply line 30 while being pressure controlled by the first MFC 32. The gas provided into the passage in the gas supply line 30 passes through the passage in the transport tube 18, the gas distribution chamber 12a, the holes 14a and the slits 12b to reach a space on the stage 11. The rate of flow of the gas supplied to the space between the stage 11 and the shower head 12 via the plurality of slits 12b can be adjusted by the first MFC 32. The first MFC 32 is also referred to as "first gas supply part".

A remote plasma unit (RPU) gate valve 40 is connected to a side surface of the transport tube 18. The RPU gate valve 40 is connected at a position on the side surface of the transport tube 18 higher in the vertical direction than the position at which the gas supply line 30 is connected. The RPU gate valve 40 is provided for the purpose of preventing mixing of the cleaning gas with the material gas by shutting off the communication between the remote plasma unit 20 and the chamber 10.

A gas supply line 50 is connected to the side surface of the chamber 10. A second MFC 52 is connected to the gas supply line 50. Gas sources 54 and 56 are connected to the second MFC 52. Each of the gas sources 54 and 56 supplies, for example, a modifier gas to be used to modify a film formed on a substrate. The gas from the gas source 54 or 56 are provided into the passage in the gas supply line 50 while being pressure controlled by the second MFC 52. The provided gas moves substantially horizontally in the gas supply line 50 to be supplied into the chamber 10 through the opening 10a. A gate valve 58 is connected to the gas supply line 50. Selection between supply and non-supply of the gas through the gas supply line 50 is made with the gate valve 58.

With the second MFC 52 and the gate valve 58, the rate of flow of the gas supplied to the space between the stage 11 and the shower head 12 through the opening 10a is adjusted. The second MFC 52 and the gate valve 58 are referred to collectively as "second gas supply part".

The rotating part 14C in the opening/closing part 14, the first gas supply part and the second gas supply part are connected to and controlled by a controller 60. A memory in which a recipe is stored and a CPU which executes the recipe stored in the memory are provided in the controller 60. Data, for example, as to timing of rotation of the rotating part 14C, the amount of rotation of the rotating part 14C, the rate and timing at which the gas is allowed to flow by the first MFC 32, the rate and timing at which the gas is allowed to flow by the second MFC 52, and timing of opening and closing of the gate valve 58 is stored in the recipe. The controller 60 controls the rotating part 14C, the first gas supply part and the second gas supply part on the basis of the recipe. A sequence of opening/closing of valves and gates other than those described above and details of processing on a substrate, for example, may also be recorded in the recipe.

A method of processing a substrate by using the substrate processing apparatus according to the first embodiment of the present invention will be described. The substrate processing method according to the first embodiment of the present invention includes a downflow processing process and a sideflow processing process. Each of the downflow processing process and the sideflow processing process is a process in which processing is performed on a substrate placed on the stage 11. Concrete examples of the downflow processing process and the sideflow processing process will be described below.

Figure 4:
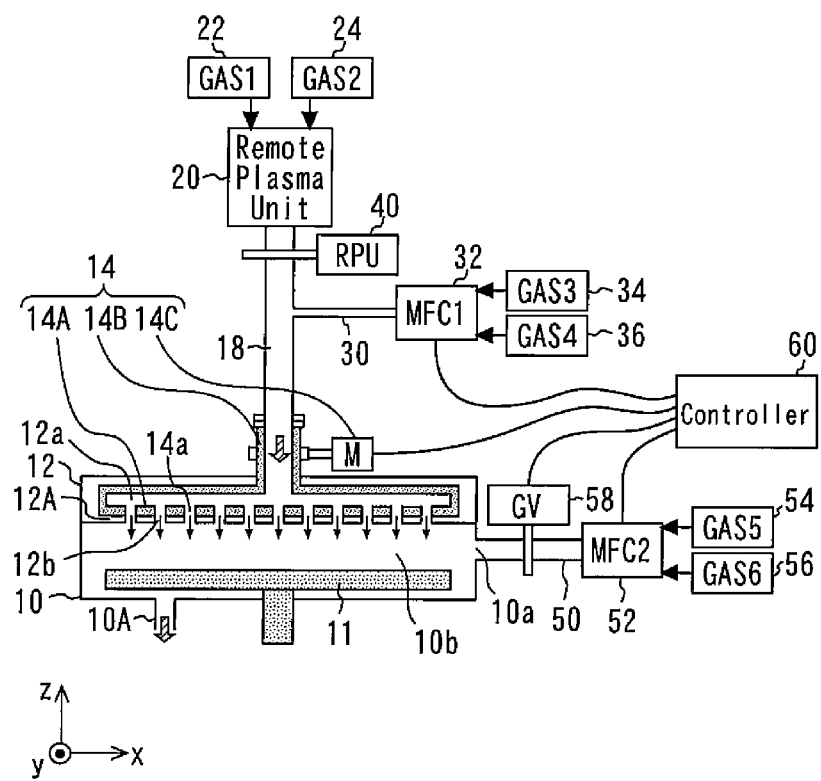
FIG. 4 is a sectional view of the substrate processing apparatus in the downflow processing process.

FIG. 4 is a sectional view of the substrate processing apparatus in the downflow processing process. The downflow processing process is performed in a state where the holes 14a of the opening/closing part 14 and the slits 12b of the shower head 12 are superposed on each other so that space 10b between the stage 11 and the shower head 12 and the gas distribution chamber 12a communicate with each other. If the holes 14a and the slits 12b do not communicate with each other before the downflow processing process, the shielding member 14A is rotated by a certain amount by driving the rotating part 14C to superpose the holes 14a on the slits 12b.

In the downflow processing process, the RPU gate valve 40 and the gate valve 58 are closed and a gas is supplied from the first MFC 32 to the space between the shower head 12 and the stage 11 via the gas supply line 30, the transport tube 18, the gas distribution chamber 12a, the plurality of holes 14a and the plurality of slits 12b. Simultaneously with this gas supply, radiofrequency waves (radiofrequency power) are applied to the shower head 12 and/or the stage 11 to perform plasma processing on a substrate on the stage 11. The process may alternatively be such that plasma processing is performed on the substrate by applying radiofrequency waves to the shower head 12 and/or the stage 11 after the supply of the gas to the space between the shower head 12 and the stage 11. Further, a process consisting of a set of steps: a step of supplying the material gas to the substrate through the slits 12b and a step of generating RF plasma may alternatively be performed a certain number of times. In the case of separately performing a step of supplying the material gas and a step of generating RF plasma, the slits 12b may be closed by the opening/closing part 14 before the step of generating RF plasma. Shower head hole discharge at the time of generation of RF plasma can be inhibited thereby.

The downflow processing process is a process in which a film is formed on a substrate by generating non-equilibrium plasma at a "low pressure" lower than 10 kPa at which the pressure of gases introduced into the chamber 10 through the slits 12b is maintained. If the downflow processing process is performed at a "high pressure" equal to or higher than 10 kPa, there is a possibility of occurrence of shower head hole discharge in the vicinities of the slits 12b. It is, therefore, preferable to perform the downflow processing process, for example, at a low pressure smaller than 10 kPa. Any particular method of film forming in the downflow processing process is not specified. For example, film forming on a substrate is performed by atomic layer deposition or chemical vapor phase deposition.

Figure 5:
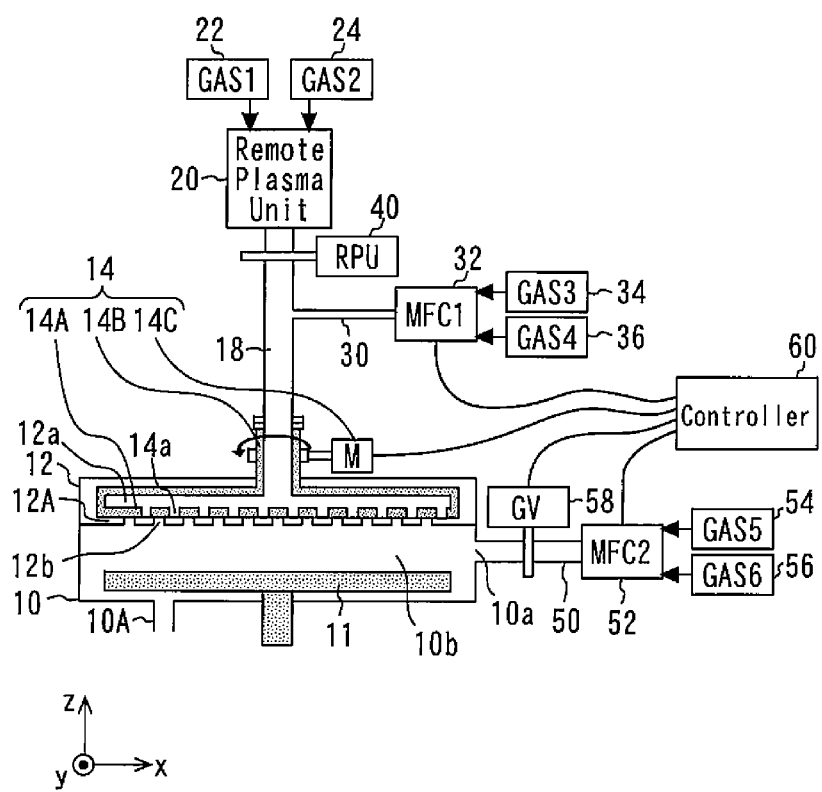
FIG. 5 is a sectional view of the substrate processing apparatus in the sideflow processing process.

FIG. 5 is a sectional view of the substrate processing apparatus in the sideflow processing process. The sideflow processing process is performed in a state where the slits 12b are closed with the shielding member 14A as a result of rotating the shielding member 14A by the rotating part 14C, RPU gate valve 40 is closed, and the gate valve 58 is opened. In the sideflow processing process, the second MFC 52 supplies a gas from the side surface of the chamber 10 to the space between the shower head 12 and the stage 11, and radiofrequency waves are applied to the shower head 12 and/or the stage 11, thereby performing plasma processing on a substrate. The process may alternatively be such that plasma processing is performed on the substrate by applying radiofrequency waves to the shower head 12 and/or the stage 11 after the supply of the gas to the space between the shower head 12 and the stage 11.

It is preferable to perform the sideflow processing process under a pressure higher than the pressure under which the downflow processing process is performed. For example, the sideflow processing process is performed in a state where the pressure in the chamber 10 is set to a "high pressure" in a range from 10 kPa to atmospheric pressure. In the sideflow processing process, high-pressure non-equilibrium capacitively coupled plasma, for example, is generated. In a case where film forming is performed under a low pressure, there is a possibility of degradation of the quality of the film formed, particularly in a side wall of the film. Degradation of the film quality may result in an undesirable condition such as an increase in etching rate. In the sideflow processing step, therefore, the film formed in the downflow processing process is modified.

In the sideflow processing process, shower head hole discharge does not occur since the slits 12b of the shower head 12 are closed and no gas is supplied through the slits 12b. As a result, non-equilibrium plasma can be generated with uniformity and stability.

Figure 6:
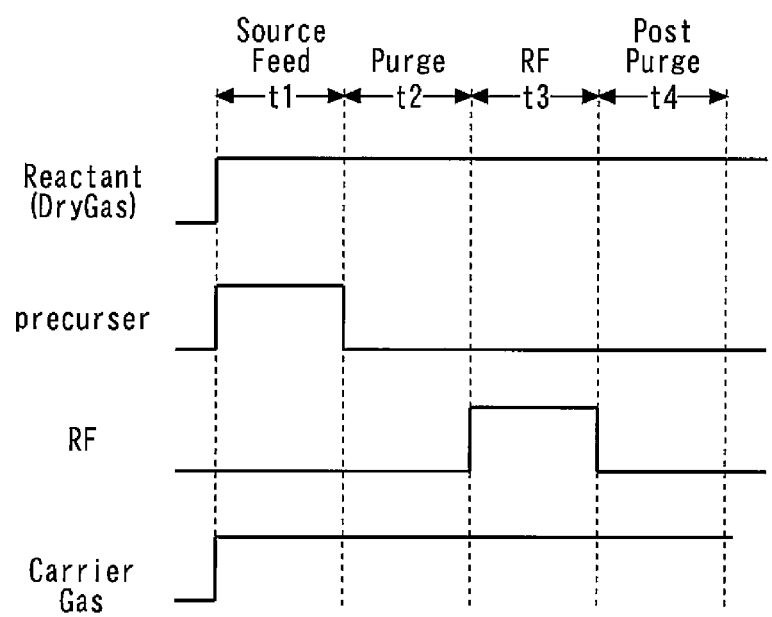
FIG. 6 is a diagram showing an example of a film forming process for ALD.

Thus, film forming processing is performed on a substrate in the downflow processing process, and modification processing is performed on a film on the substrate in the sideflow processing process. Atomic layer deposition (ALD) can be performed on a substrate by alternately performing the downflow processing process and the sideflow processing process. FIG. 6 is a diagram showing an example of a film forming process for ALD. Processing indicated with time periods t1 to t4 is performed in the downflow processing process. A reactant and a carrier gas are continuously supplied into the chamber through the time periods t1 to t4. A precursor is introduced into the chamber only in the time period t1. RF application to the shower head 12 is performed in the time period t3. One cycle of film forming is executed under a low pressure through t1 to t4. Thereafter, a post-treatment with high-pressure plasma is performed as sideflow processing process.

Figure 7:
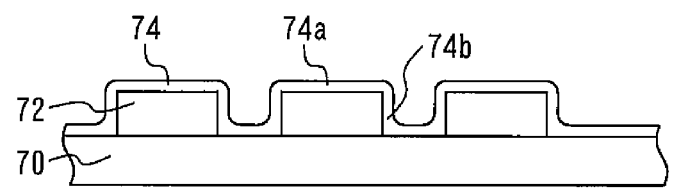
FIG. 7 is a diagram showing an example of a film formed by ALD.

FIG. 7 is a diagram showing an example of a film formed by ALD. A pattern 72 formed of rectangular portions as viewed in section was formed on a substrate 70. Thin film 74 was thereafter formed by ALD or CVD. The thin film 74 may be $SiO_2$, $Si_3N_4$, etc. The thin film 74 has top portions 74a formed on the pattern 72 and side wall portions 74b formed on side walls of the pattern 72. The film quality of the side wall portions 74b can be improved by the substrate processing method according to the first embodiment of the present invention since the method includes the sideflow processing process performed under a high pressure. Such processing can be realized with the substrate processing apparatus shown in FIG. 1 as an apparatus capable of generating low-pressure non-equilibrium plasma and high-pressure non-equilibrium plasma with uniformity and stability by using one chamber.

Figure 8:
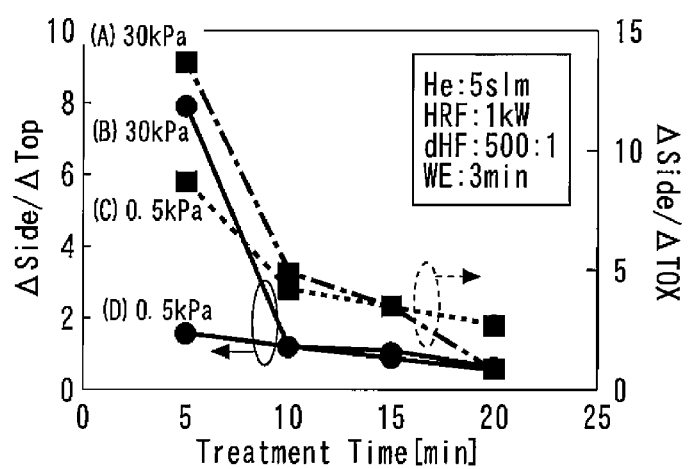
FIG. 8 is a diagram showing the relationship between the pressure at the time of plasma modification and a film characteristic.

FIG. 8 is a diagram showing the relationship between the pressure at the time of plasma modification and a film characteristic. Modification processing with He plasma at 30 kPa or 0.5 kPa was performed on $SiO_2$ thin film formed to a thickness of 25 nm on the rectangular pattern 72 shown in FIG. 7, and wet etching was thereafter performed on the film. Comparison was made between film quality improvement effects on the side wall portions. The ordinate on the right hand side indicates a value as a result of division of the depth of etching on the side wall portions (ΔSide) by the depth of etching of the silicon thermal oxide (ΔTOX). The silicon thermal oxide is a flat thin film formed on the surface of silicon substrate at high temperature. Accordingly, the ordinate on the right hand side represents the absolute depth of etching on the side wall portions. Because there is a need to prevent abnormally rapid progress of etching, it is preferable that the absolute depth of etching be small.

The ordinate on the left hand side indicates a value as a result of division of the depth of etching on the side wall portions (ΔSide) by the depth of etching on top portions (ΔTop). Accordingly, the ordinate on the left hand side represents a relative depth of etching. Because it is ideal that the depth of etching on the top portions and the depth of etching on the side wall portions are equal to each other, the ideal value on the ordinate on the left hand side is 1. Helium was used for modification processing. Etching was performed with dilute hydrofluoric acid (dHF) for three minutes.

In (A) of FIG. 8, the absolute depth of etching when modification processing was performed at a high pressure of 30 kPa for 5 min., 10 min., 15 min., and 20 min. is shown. In (B), the relative depth of etching when modification processing was performed at a high pressure of 30 kPa for 5 min., 10 min., 15 min., and 20 min. is shown. In (C), the absolute depth of etching when modification processing was performed at a low pressure of 0.5 kPa for 5 min., 10 min., 15 min., and 20 min. is shown. In (D), the relative depth of etching when modification processing was performed at a low pressure of 0.5 kPa for 5 min., 10 min., 15 min., and 20 min. is shown.

In the results obtained when the modification processing time was 20 min., the results shown in (A) and (B) of modification processing performed under the high pressure are generally better than the results shown in (C) and (D) of modification processing performed under the low pressure. These measurement results suggest a possibility of enabling forming of oxide film or nitride film uniform in film thickness and quality on the pattern by performing modification processing under a pressure from quasi-atmospheric pressure to atmospheric pressure.

Figure 9:
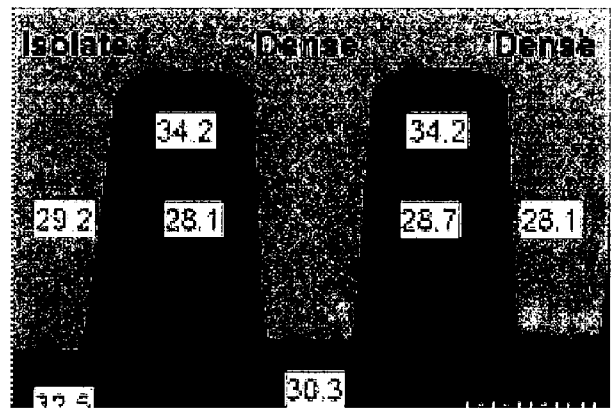
FIG. 9 is a sectional view of the thin film.
Figure 10:
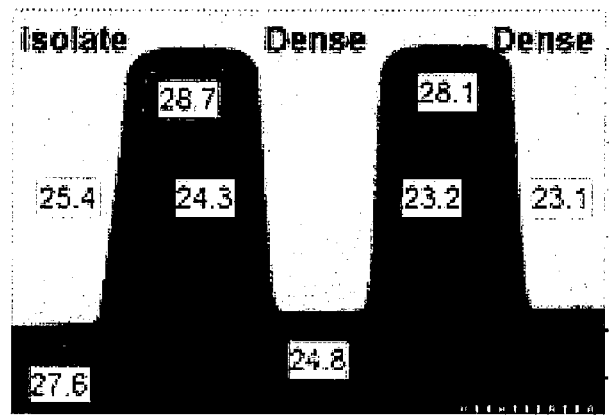
FIG. 10 is a sectional view of the thin film after wet etching processing.

FIGS. 9 and 10 are STEM sectional views of the thin film formed by the substrate processing method according to the first embodiment of the present invention. Numeric values are shown in nanometers (nm) in FIGS. 9 and 10. FIG. 9 is a sectional view of the thin film after a sequence of processing steps in which forming of $SiO_2$ by low-pressure plasma-enhanced ALD (PEALD) is repeated fifteen times and He plasma modification processing (post-treatment) under a high pressure of 25 kPa is thereafter performed was executed a certain number of times. In the low-pressure PEALD, aminosilane (BDEAS) was used as a material gas and the pressure was set to 0.4 kPa.

FIG. 10 is a sectional view of the thin film after wet etching processing with dilute hydrofluoric acid was performed on the sample shown in FIG. 9. In this case, ΔSide/ΔTOX was 2.3 and ΔSide/ΔTop was 0.8. From these results, it can be understood that high-pressure plasma modification processing is effective in improving the film quality of the side portions of the thin film.

The substrate processing apparatus according to the first embodiment of the present invention can generate a plasma by supplying a gas onto a substrate through the slits 12b of the shower head 12 and can also generate a plasma by supplying a gas onto the substrate through a side of the chamber 10 without leading the gas via the slits 12b, thereby enabling various kinds of substrate processing. The substrate processing apparatus is therefore capable of executing kinds of processing other than those according to the above-described substrate processing method. For example, only a downflow processing process may be executed during a time period for manufacturing a particular product, and only a sideflow processing process may be executed during a time period for manufacturing a different product. A film may be formed on a substrate by such a sideflow processing process. That is, a sideflow processing process under a high pressure may be executed to form a film on a substrate.

A downflow processing process is defined as a process in which a gas is supplied to a substrate through the slits 12b to process the substrate. A sideflow processing process is defined as a process in which a gas is supplied to a substrate through a side of the chamber 10 without leading gas through the slits 12b to process the substrate. Accordingly, processing other than film forming may be performed in a downflow processing process, and processing other than modification may be performed in a sideflow processing process. For example, in a sideflow processing process, a film forming step of forming a film on a substrate by atomic layer deposition or chemical vapor phase deposition and a modification step of modifying the surface of a substrate may be performed. In such a case, the film forming step and the modification step can be performed under a high pressure.

In the first embodiment of the present invention, a pressure lower than 10 kPa is assumed to be a low pressure while a pressure equal to or higher than 10 kPa is assumed to be a high pressure. A low pressure and a high pressure, however, may be defined by a different method. As long as the first gas supply part is of such a construction as to be capable of supplying a gas to the gas distribution chamber 12a and stopping supply of the gas to the gas distribution chamber 12a, it is not limited to the first MFC 32. The construction of the second gas supply part can also be changed as desired. Opening/closing of the slits 12b may be realized by a component other than the opening/closing part 14. A gas in the chamber 10 may be discharged not through the exhaust hole 10A but through an annular exhaust duct surrounding the stage 11.

These modifications can also be applied as desired to a substrate processing apparatus and a substrate processing method according to an embodiment described below. The substrate processing apparatus and the substrate processing method according to the embodiment described below have a number of commonalties with the first embodiment and will therefore be described mainly with respect to points of difference from the first embodiment.

Second Embodiment

Figure 11:
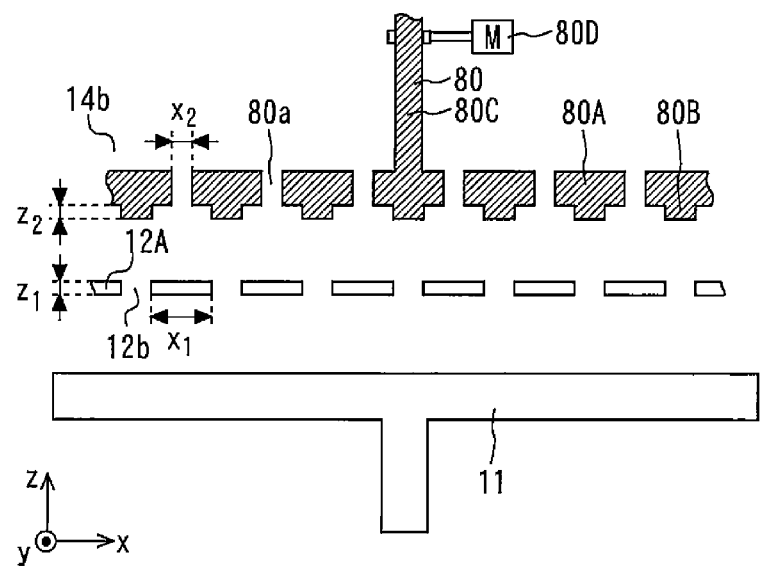
FIG. 11 is a partially sectional view of a substrate processing apparatus according to a second embodiment.

FIG. 11 is a partially sectional view of a substrate processing apparatus according to a second embodiment of the present invention. A feature of the substrate processing apparatus according to the second embodiment resides in an opening/closing part 80. The opening/closing part 80 includes a plate part 80A, projections 80B, a supporting part 80C and a moving part 80D. The plate part 80A is a plate in which a plurality of openings 80a are formed. The shape of each opening 80a is not particularly specified. However, it is preferable to provide a multiplicity of comparatively small openings 80a in order to secure the desired mechanical strength of the plate part 80A and promote diffusion of a gas. A plurality of projections 80B are provided on a lower surface of the plate part 80A. The projections 80B are portions for closing the slits 12b. The number of projections 80B is therefore equal to the number of slits 12b.

The supporting part 80C is a rod connected to the plate part 80A and extending along the z-direction. The moving part 80D is fixed to the supporting part 80C. The moving part 80D moves the supporting part 80C along the z-plus/minus direction (vertical direction) by driving a motor or the like. The plate part 80A can therefore be moved vertically by the moving part 80D. The thickness z1 of the plate 12A of the shower head 12 is equal to the height z2 of the projections 80B. The width x1 of the portions of the plate 12A between adjacent pairs of the slits 12b is larger than the width x2 of the openings 80a.

A downflow processing process is performed while the slits 12b are open, as shown in FIG. 11. Since the plate part 80A exists in the gas distribution chamber 12a, there is a possibility of the flow of a gas being obstructed by the plate part 80A. The openings 80a are therefore provided in the plate part 80A to enable the gas to pass through the openings 80a.

Figure 12:
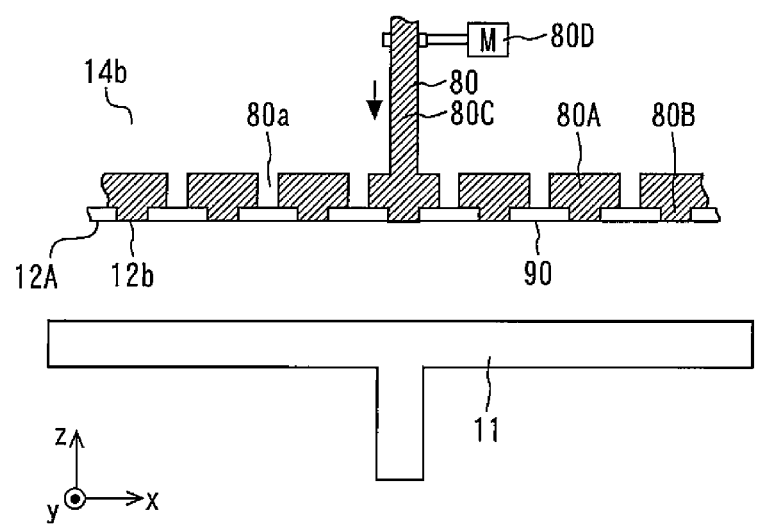
FIG. 12 is a sectional view of the opening/closing part and other components in a sideflow processing process.

FIG. 12 is a sectional view of the opening/closing part 80 and other components in a sideflow processing process. In the sideflow processing process, the plate part 80A is moved along the z-minus direction (downward) by using the moving part 80D so that the plurality of projections 80B are fitted in the slits 12b. The plurality of slits 12b are closed thereby. In this state, lower surfaces of the projections 80B and a lower surface of the shower head 12 (a lower surface of the plate 12A) form one flat surface 90.

In the first embodiment, recesses are formed between the lower surface of the plate 12A and the lower surface of the shielding member 14A when the slits 12b are closed. Non-uniformity of an electric field distribution between the shower head 12 and the stage 11 and, hence, generation of an arc may occur due to the recesses. In the substrate processing apparatus according to the second embodiment, however, the lower surfaces of the projections SOB and the lower surface of the shower head 12 form one flat surface 90 and, therefore, the uniformity of the electric field can be improved.

Further, in the sideflow processing process according to the second embodiment, the openings 80a are closed with the plate 12A of the shower head 12, thereby preventing a gas from being supplied to the substrate through the openings 80a and the slits 12b. When the downflow processing process is performed after the sideflow processing process, the plate part 80A is moved along the z-plus direction by the moving part 80D to be returned to the state shown in FIG. 11.

According to the present invention, supply of a material to a substrate from above the chamber through the slits in the shower head and supply of a material to the substrate from a side wall of the chamber without feeding the material through the slits are made possible, thus enabling generating low-pressure non-equilibrium plasma and high-pressure non-equilibrium plasma with uniformity and stability.

Obviously many modifications and variations of the present invention are possible in the light of the above teachings. It is therefore to be understood that within the scope of the appended claims the invention may be practiced otherwise than as specifically described.

What is claimed is:

1. A substrate processing apparatus comprising:
   a chamber;
   a stage provided in the chamber;
   a shower head in which a plurality of slits are formed, and which is opposed to the stage;
   an opening/closing part for covering and uncovering the plurality of slits;
   a first gas supply part which supplies a gas to a space between the stage and the shower head via the plurality of slits; and
   a second gas supply part which is connected to a side wall of the chamber, and which supplies a gas to the space between the stage and the shower head.

2. The substrate processing apparatus according to claim 1, wherein the first gas supply part has a first mass flow controller which adjusts a gas flow rate, and
   the second gas supply part has a second mass flow controller which adjusts the gas flow rate, and a gate valve.

3. The substrate processing apparatus according to claim 1, further comprising a controller which controls the opening/closing part, the first gas supply part and the second gas supply part.

4. A substrate processing apparatus comprising:
   a chamber;
   a stage provided in the chamber;
   a shower head in which a plurality of slits are formed, and which is opposed to the stage;
   an opening/closing part for opening and closing the plurality of slits;
   a first gas supply part which supplies a gas to a space between the stage and the shower head via the plurality of slits; and
   a second gas supply part which is connected to a side wall of the chamber, and which supplies a gas to the space between the stage and the shower head,
   wherein the opening/closing part includes:
      a shielding member in which a plurality of holes are provided; and
      a rotating part which rotates the shielding member.

5. A substrate processing apparatus comprising:
   a chamber;

a stage provided in the chamber;

a shower head in which a plurality of slits are formed, and which is opposed to the stage;

an opening/closing part for opening and closing the plurality of slits;

a first gas supply part which supplies a gas to a space between the stage and the shower head via the plurality of slits; and a second gas supply part which is connected to a side wall of the chamber, and which supplies a gas to the space between the stage and the shower head, wherein the opening/closing part includes:
- a plate part having openings;
- a plurality of projections provided on a lower surface of the plate part; and
- a moving part which vertically moves the plate part, and wherein the plurality of projections are fitted in the plurality of slits when the plurality of slits are closed.

6. The substrate processing apparatus according to claim 5, wherein in a state where the slits are closed by fitting the plurality of projections in the slits, lower surfaces of the projections and a lower surface of the shower head form one flat surface.

7. The substrate processing apparatus according to claim 5, wherein in a state where the slits are closed by fitting the plurality of projections in the slits, the openings are closed by the shower head.

* * * * *